(12) United States Patent
Kawamura et al.

(10) Patent No.: US 10,118,317 B2
(45) Date of Patent: Nov. 6, 2018

(54) TEMPLATE AND PATTERN FORMATION METHOD

(71) Applicant: TOSHIBA MEMORY CORPORATION, Tokyo (JP)

(72) Inventors: Yoshihisa Kawamura, Mie (JP);
Masayuki Hatano, Kanagawa (JP);
Yohko Komatsu, Kanagawa (JP);
Hiroyuki Kashiwagi, Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 363 days.

(21) Appl. No.: 14/840,625

(22) Filed: Aug. 31, 2015

(65) Prior Publication Data

US 2016/0346962 A1 Dec. 1, 2016

(30) Foreign Application Priority Data

May 27, 2015 (JP) .................. 2015-107823

(51) Int. Cl.
*B29C 33/42* (2006.01)
*H01L 21/02* (2006.01)
*B29C 43/02* (2006.01)
*B29C 43/36* (2006.01)
*B82Y 10/00* (2011.01)
*B82Y 40/00* (2011.01)
*B29L 31/34* (2006.01)

(52) U.S. Cl.
CPC .......... *B29C 33/424* (2013.01); *B29C 43/021* (2013.01); *B29C 43/36* (2013.01); *H01L 21/02118* (2013.01); *H01L 21/02318* (2013.01); *H01L 21/02348* (2013.01); *B29C 2033/426* (2013.01); *B29C 2043/025* (2013.01); *B29L 2031/34* (2013.01); *B82Y 10/00* (2013.01); *B82Y 40/00* (2013.01); *Y10S 977/887* (2013.01)

(58) Field of Classification Search
CPC ....................................................... G03F 7/002
See application file for complete search history.

(56) References Cited

U.S. PATENT DOCUMENTS

| | | | |
|---|---|---|---|
| 7,070,405 B2 * | 7/2006 | Sreenivasan | B29C 35/0888 425/174.4 |
| 8,361,371 B2 | 1/2013 | Khusnatdinov et al. | |
| 8,641,958 B2 | 2/2014 | Khusnatdinov et al. | |
| 2004/0141163 A1 * | 7/2004 | Bailey | B29C 35/0888 355/18 |
| 2008/0090170 A1 | 4/2008 | Yoneda | |
| 2008/0303187 A1 | 12/2008 | Stacey et al. | |

(Continued)

FOREIGN PATENT DOCUMENTS

| | | |
|---|---|---|
| JP | 2007-283674 A | 11/2007 |
| JP | 2008-091782 A | 4/2008 |
| JP | 2011-521438 A | 7/2011 |

(Continued)

*Primary Examiner* — Christina A Johnson
*Assistant Examiner* — Kelsey C Grace
(74) *Attorney, Agent, or Firm* — Finnegan, Henderson, Farabow, Garrett & Dunner, L.L.P.

(57) ABSTRACT

According to one embodiment, a template includes a template pattern and a liquid repellent pattern. The template pattern is formed on a substrate. The liquid repellent pattern has liquid repellency to a resist and are disposed on a periphery of a region for arrangement of the template pattern.

16 Claims, 15 Drawing Sheets

(56) References Cited

U.S. PATENT DOCUMENTS

2013/0241109 A1  9/2013  Khusnatdinov et al.

FOREIGN PATENT DOCUMENTS

| JP | 5216871 B | 3/2013 |
| JP | 2013-214627 A | 10/2013 |
| JP | 2014-160754 A | 9/2014 |
| WO | WO 2009/099666 A1 | 8/2009 |

* cited by examiner

FIG.1A
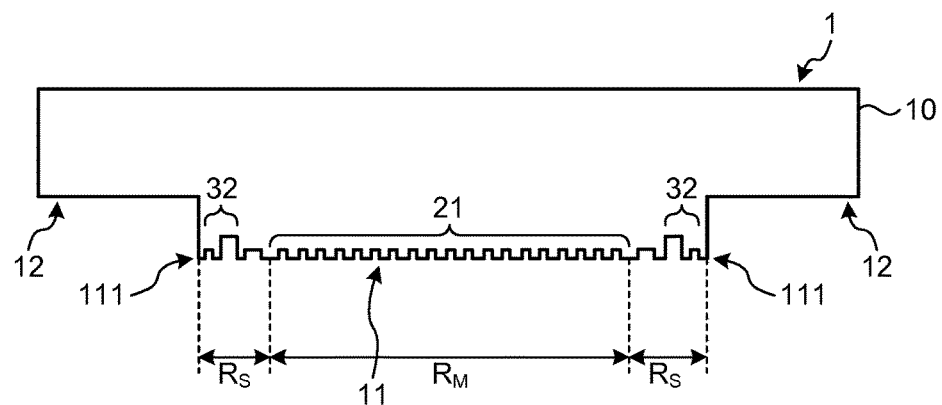
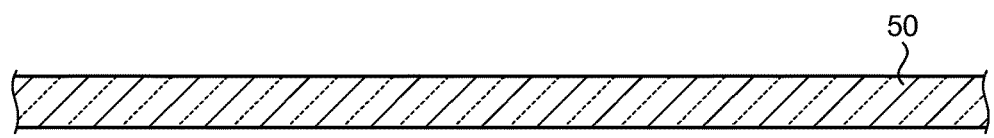
FIG.1B
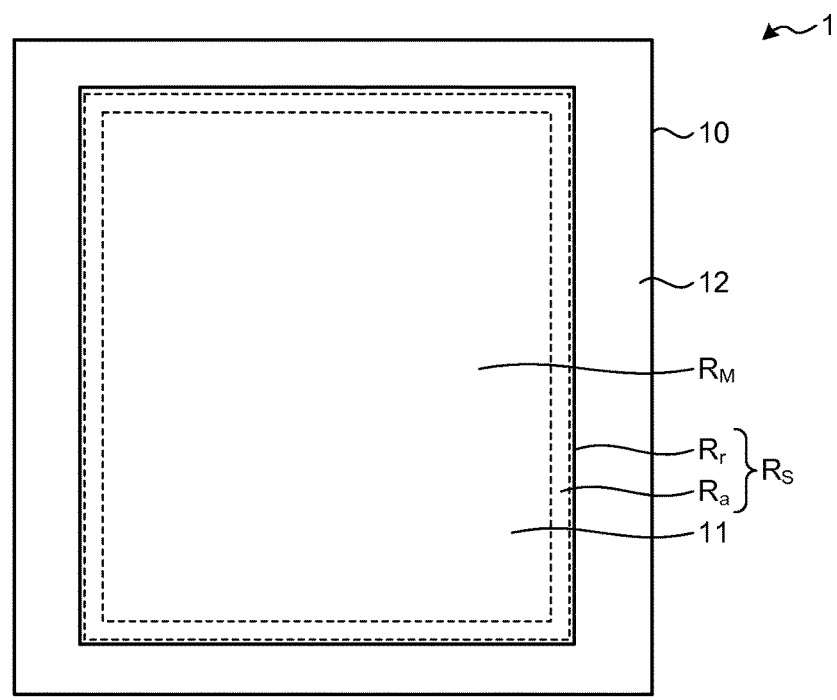

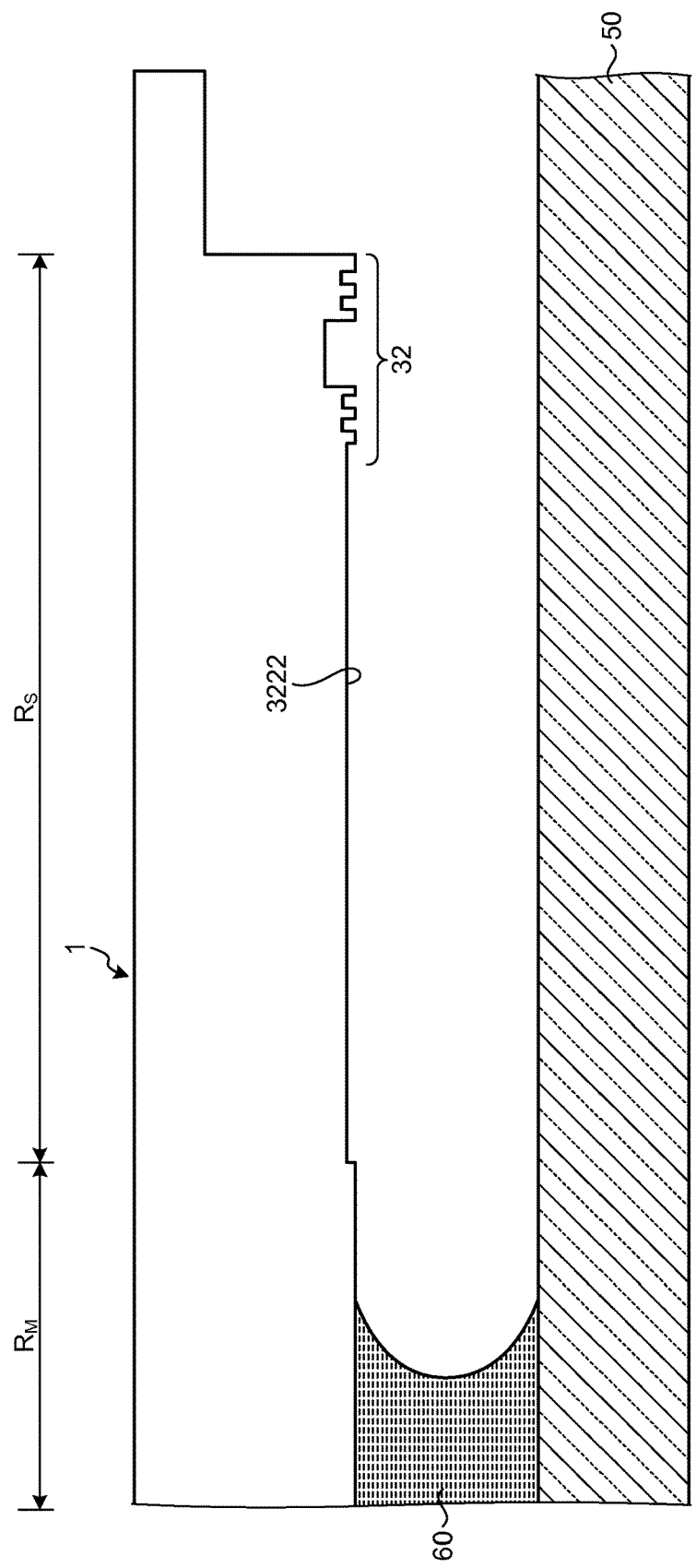

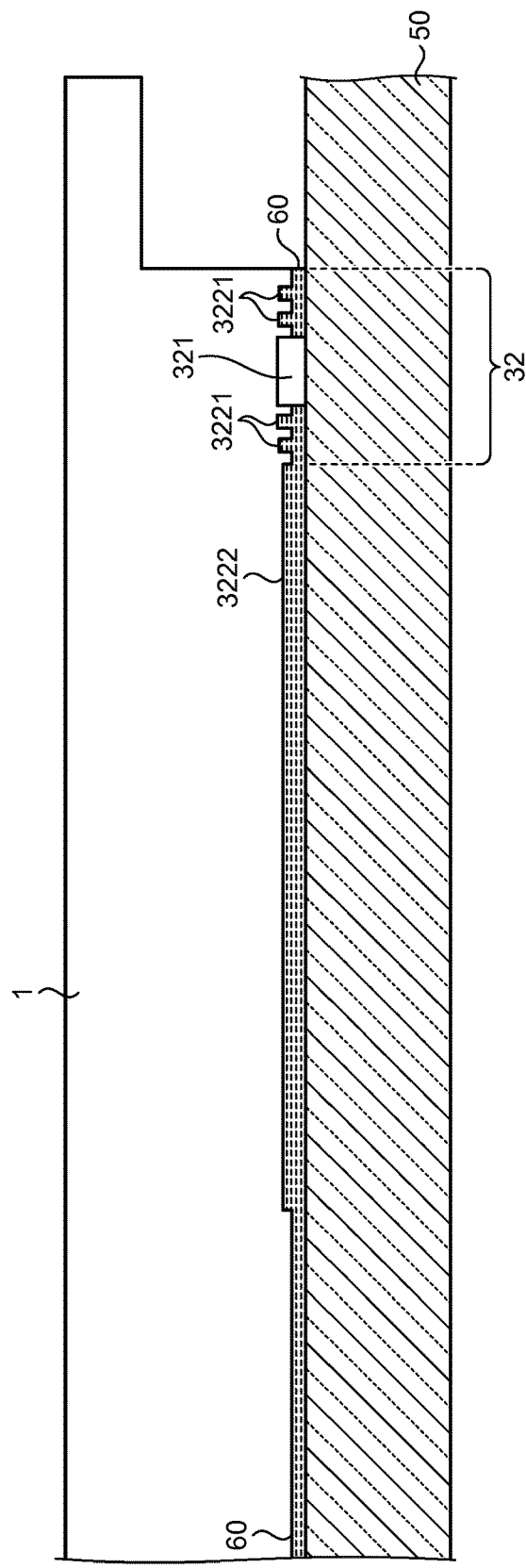

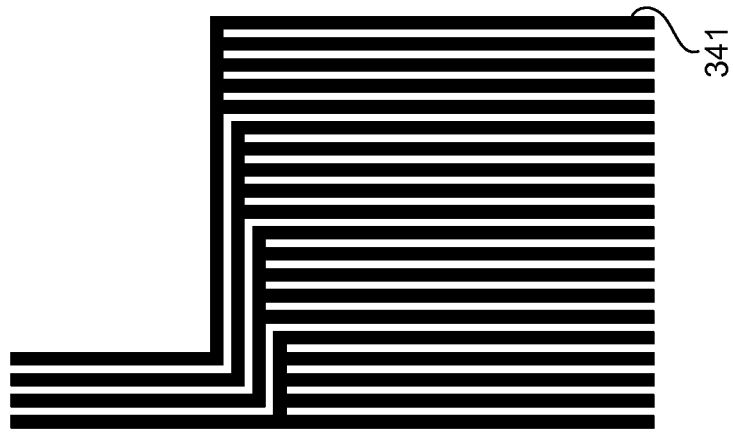
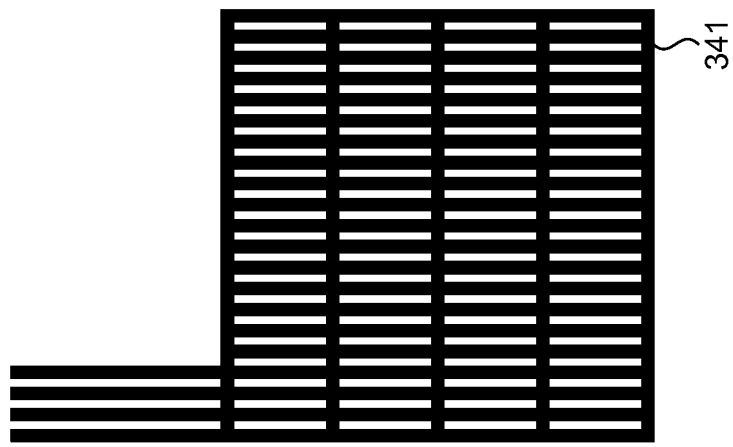
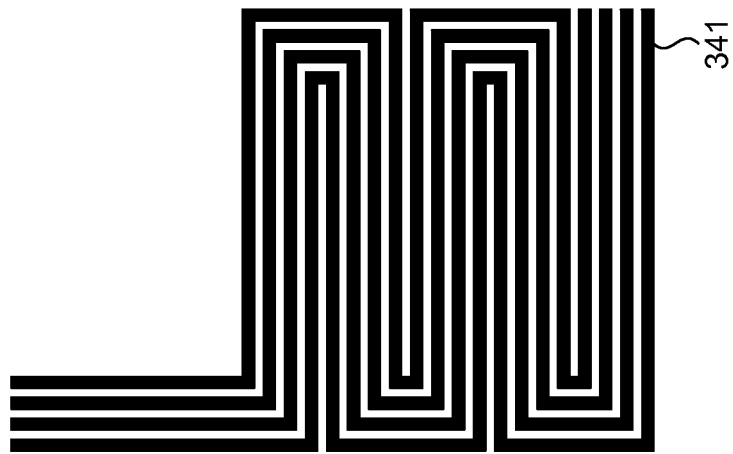

TEMPLATE AND PATTERN FORMATION METHOD

CROSS-REFERENCE TO RELATED APPLICATIONS

This application is based upon and claims the benefit of priority from Japanese Patent Application No. 2015-107823, filed on May 27, 2015; the entire contents of which are incorporated herein by reference.

FIELD

Embodiments described herein relate generally to a template and a pattern formation method.

BACKGROUND

In recent years, a nano-imprint method attracts attention as a technique for forming fine patterns. According to the nano-imprint method, a template is brought into contact with a resist applied on a substrate to be processed, so that concave patterns of the template are filled with the resist. Then, the resist is cured by irradiation with light, such as ultraviolet rays. The resist is made of a photo-setting material. Thereafter, the template is released from the resist. Consequently, a resist pattern is formed such that it has concave and convex patterns reversed from those formed on the template.

The template has a mesa structure that includes a mesa surface provided with the concave and convex patterns and an off-mesa surface other than the mesa surface, such that the mesa surface protrudes by several tens μm relative to the off-mesa surface. When pressing is performed by use of the template having this structure, a phenomenon occurs such that the resist is leaked out from part of the mesa end. As a result, a leaked resist portion is formed as a resist structure with a height of several μm at the mesa end. The leaked resist portion has a height about 100 times larger than that of the main pattern formed by nano-imprint. Accordingly, if the template includes the leaked resist portion thus formed, it becomes difficult to perform resist removal and reworking, after processing. Further, in a case where a nano-imprint process is performed by use of a step and repeat method, when the imprint process is applied to a region near an imprinted region at which the leakage has occurred, the leaked resist portion hinders pressing of the template and thereby generates an unfilled defect of a large scale.

BRIEF DESCRIPTION OF THE DRAWINGS

FIGS. 1A and 1B are views schematically showing an example of the structure of a template according to a first embodiment;

FIGS. 5A to 5C are a partial sectional views schematically showing an example of the process sequence of an imprint method according to the first embodiment;

FIGS. 8A to 8C are plan views showing other examples of a liquid collecting portion according to the second embodiment;

DETAILED DESCRIPTION

Figure 2:
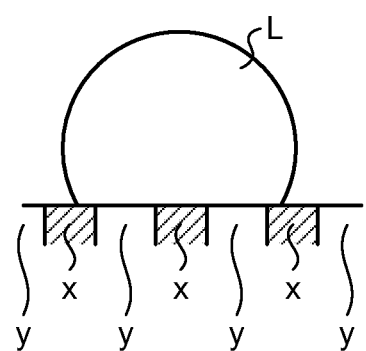
FIG. 2 is a view for explaining a lotus effect.

In general, according to one embodiment, a template includes a template pattern and a liquid repellent pattern. The template pattern is formed on a substrate. The liquid repellent pattern has liquid repellency to a resist and are disposed on a periphery of a region for arrangement of the template pattern.

Exemplary embodiments of a template and a pattern formation method will be explained below in detail with reference to the accompanying drawings. The present invention is not limited to the following embodiments. The plan views and sectional views of a template used in the following embodiments are schematic. For example, the ratio between the vertical length and horizontal length of each member and/or the dimensional ratios between respective members in the plan views may be different from actual states, and the relationship between the thickness and width of each layer and/or the thickness ratios between respective layers in the sectional views may be different from actual states.

(First Embodiment)

FIGS. 1A and 1B are views schematically showing an example of the structure of a template according to a first embodiment, FIG. 1A is a sectional view of the template, and FIG. 1B is a plan view thereof on the pattern formation face side. The template 1 is prepared by forming a transfer pattern composed of concave and convex portions on a template substrate 10. The template substrate 10 is made of a material that transmits ultraviolet rays, such as quartz or fluorite. The template substrate 10 has a mesa structure in which the surface of its central region to be pressed onto a process object substrate 50 protrudes relative to its peripheral edge region. In this specification, the protruding region of the template substrate 10 will be referred to as a mesa surface 11, and the surface of the template substrate 10 other than the mesa surface 11 will be referred to as an off-mesa surface 12. The mesa surface 11 protrudes by several tens μm relative to the off-mesa surface 12. Further, the end position of the mesa surface 11 will be referred to as a mesa end 111. The template 1 is placed such that the mesa surface 11 faces the substrate 50.

The mesa surface 11 includes a main pattern arrangement region $R_M$ where main patterns 21 for forming a device are arranged, and an auxiliary pattern arrangement region $R_S$ where auxiliary patterns, such as alignment marks, are arranged. When seen in the plan view, for example, the main pattern arrangement region $R_M$ is a rectangular region, and the auxiliary pattern arrangement region $R_S$ is a rectangular ring region arranged around the main pattern arrangement region $R_M$. Here, the auxiliary pattern arrangement region $R_S$ preferably has a width of 500 µm or less. Further, the main pattern arrangement region $R_M$ and the auxiliary pattern arrangement region $R_S$ define a shot region (or imprint region).

The main patterns 21 are patterns for forming a semiconductor device, for example. The patterns for forming a semiconductor device are exemplified by a memory formation pattern for forming a NAND type flash memory, a peripheral circuit formation pattern for forming a peripheral circuit for driving the NAND type flash memory, and so forth. The memory formation pattern may be exemplified by line and space patterns, in which a plurality of line-shaped concave patterns for forming word lines, each having a width of several tens nm or less, are arranged at predetermined intervals in a direction perpendicular to the extending direction of the concave patterns, for example. Further, the concave portions of the main patterns 21 have a depth of several tens nm, for example.

The auxiliary pattern arrangement region $R_S$ includes an alignment mark arrangement region $R_a$ and a liquid repellent pattern arrangement region $R_r$. In the alignment mark arrangement region $R_a$, alignment marks are arranged. The alignment marks are marks used for performing alignment between layers formed on upper and lower sides in the process of manufacturing a semiconductor device, for example. The concave portions of the alignment marks have a depth of several tens nm, for example, as in the main patterns 21.

In the liquid repellent pattern arrangement region $R_r$, liquid repellent patterns 32 are arranged. The liquid repellent patterns 32 are patterns for preventing a resist used as an imprint agent from being leaked out from the mesa end 111 during the imprint process. The liquid repellent patterns 32 are formed of patterns that are arranged along the peripheral edge portion of the mesa surface 11 and manifest liquid repellency to the resist.

More specifically, the liquid repellent patterns 32 are made to manifest liquid repellency by deliberately forming patterns that can provide bubble trapping. The principle of the patterns is an application of a lotus effect that the leaf surface of lotus repels water strongly. FIG. 2 is a view for explaining a lotus effect. FIG. 2 shows a state where liquid L is present on a region including a component "x" and a component "y" alternately arranged. It is assumed that the component "x" is lyophilic and the component "y" is lyophobic (liquid repellent). Further, where "f" (here, 0<f<1) denotes the ratio of the components "x" occupying the surface of a region in contact with the liquid L, the ratio of the components "y" occupying the surface is expressed by 1−f. Further, where θx and θy respectively denote the true contact angles of the components "x" and "y", and φ denotes the apparent contact angle of the liquid L, the relationship expressed by the following formula (1) is satisfied.

$$\cos \phi = f \cos \theta x + (1-f)\cos \theta y \quad (1)$$

Here, if it is assumed that the component "y" is air, the contact angle (θy) between the air and the liquid L becomes 180°. The wetness of the surface manifesting the lotus effect can be expressed by the following formula (2), which is the Cassie-Baxter formula, obtained from the formula (1).

$$\cos \phi = f \cos \theta x + f - 1 \quad (2)$$

Here, since the "f" denotes the surface area ratio of the lyophilic components "x" in contact with the liquid L, 1−f denotes the surface area ratio of the air in contact with the liquid L, i.e., the ratio of the bubble trapping regions. Further, in order to make a liquid repellent effect manifested, it is necessary to set the apparent contact angle φ to be 90° or more. From the formula (2), it is understood that, with an increase in the ratio (1−f) of the bubble trapping regions, i.e., with a decrease in "f", a stronger liquid repellent effect is manifested. For example, where θx=20° and (1−f)=0.8, φ≈128° and so a liquid repellent effect (φ>90°) is manifested.

Figure 3:
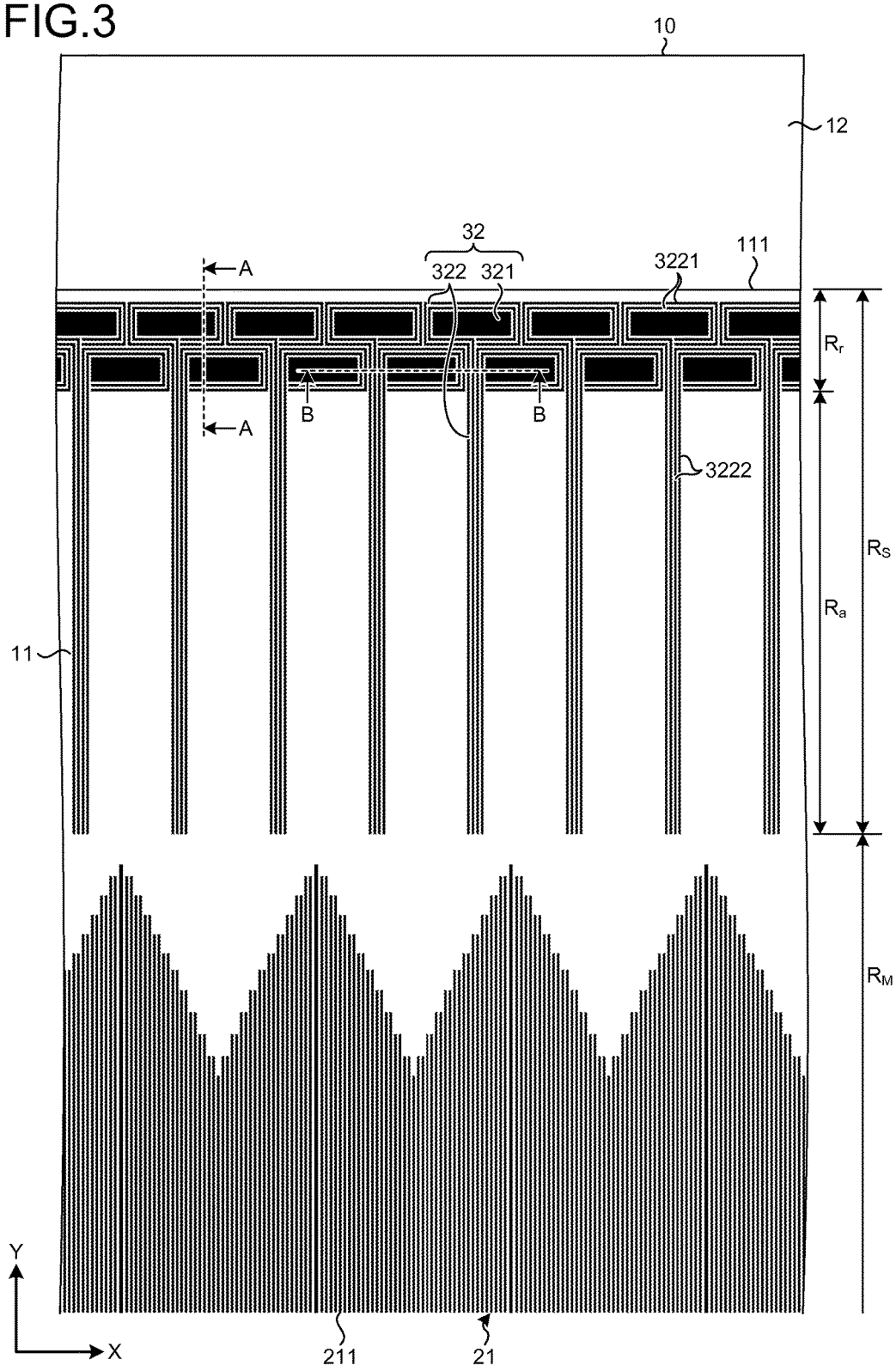
FIG. 3 is a partial plan view schematically showing an example of patterns on a mesa surface, which include liquid repellent patterns, according to the first embodiment.
Figure 4A:
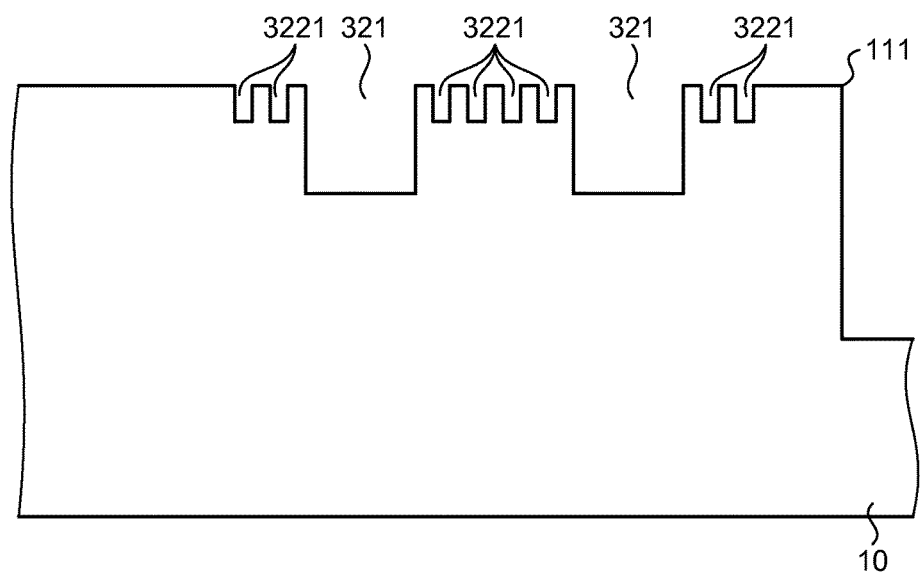
FIGS. 4A and 4B are partial sectional views each schematically showing an example of a sectional structure of the liquid repellent patterns.
Figure 4B:
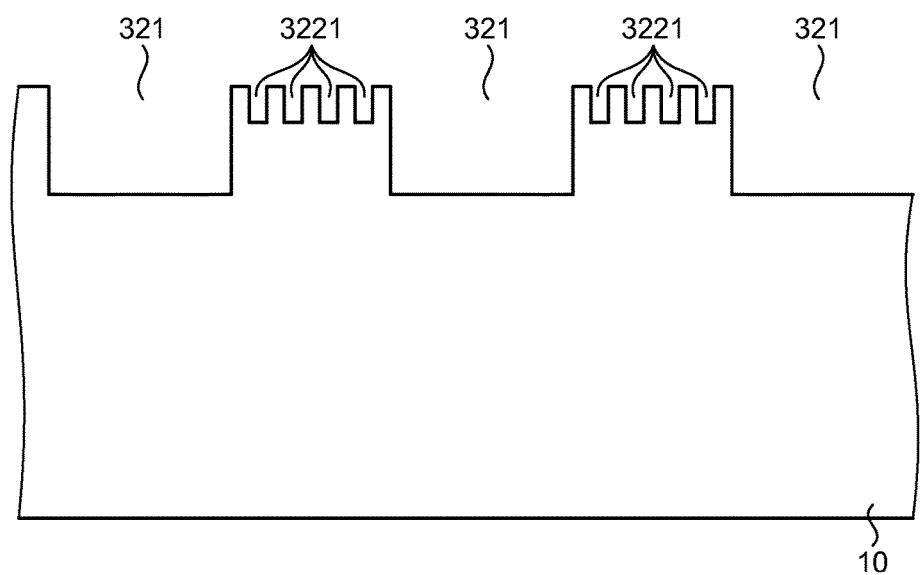

In light of the matters described above, according to this embodiment, the auxiliary pattern arrangement region $R_S$ at the peripheral edge portion of the mesa surface 11 is provided with the liquid repellent patterns 32 including portions to serve as bubble trapping regions and portions to reduce contact with a lyophilic component. FIG. 3 is a partial plan view schematically showing an example of patterns on a mesa surface, which include liquid repellent patterns, according to the first embodiment. FIGS. 4A and 4B are partial sectional views each schematically showing an example of a sectional structure of the liquid repellent patterns, FIG. 4A is a sectional view taken along a line A-A in FIG. 3, and FIG. 4B is a sectional view taken along a line B-B in FIG. 3. In the plan views used for the following explanation, portions corresponding to concave patterns are indicated by black hatching.

As described above, the mesa surface 11 includes the main pattern arrangement region $R_M$ and the auxiliary pattern arrangement region $R_S$. In this example, the main pattern arrangement region $R_M$ is provided with the main patterns 21 of a line and space form, in which line patterns 211 extending in a Y-direction are arranged at predetermined intervals in an X-direction. Here, the line patterns 211 are formed of concave patterns.

The auxiliary pattern arrangement region $R_S$ is provided with the liquid repellent patterns 32 at the outer peripheral edge portion. Each liquid repellent pattern 32 includes a bubble trapping portion 321 and a liquid guide portion 322. The bubble trapping portions 321 are respectively formed of concave patterns dug in the template substrate 10 along the peripheral edge portion of the auxiliary pattern arrangement region $R_S$. In the example shown in FIG. 3, each bubble trapping portion 321 has a rectangular shape, when seen in the plan view. Further, the bubble trapping portions 321 are arrayed in a plurality of rows arranged in an inward direction from the peripheral edge portion of the mesa surface 11. In this case, the bubble trapping portions 321 are preferably arrayed in a staggered arrangement. The bubble trapping portions 321 can manifest a lotus structure by holding gas (air) therein.

Each rectangular bubble trapping portion 321 is preferably designed to have a one-side length of 0.5 µm or more. If one side of the rectangular pattern has a length of less than 0.5 µm, the inside of each bubble trapping portion 321 is filled with the resist, and so the bubble trapping portion 321 can hardly trap gas. When seen in the plan view, the sizes of the bubble trapping portions 321 become smaller in an inward direction from the peripheral edge portion of the mesa surface 11. Further, the depth of the bubble trapping portions 321 may be set the same as the depth of the main patterns 21 or may be set larger than the depth of the main patterns 21. The depth of the bubble trapping portions 321 is preferably set to 100 nm to 300 nm, for example. Further, the bubble trapping portions 321 are preferably arranged within a region of 5 µm from the mesa end 111.

Each liquid guide portion 322 includes a plurality of surrounding patterns 3221 concentrically arranged at predetermined intervals around the corresponding one of the bubble trapping portions 321, and a plurality of guiding patterns 3222 respectively connected to the surrounding patterns 3221 and extending to near the main pattern arrangement region $R_M$ of the mesa surface 11. The respective patterns forming the liquid guide portions 322 are arranged without being connected to each other. Further, the respective patterns forming the liquid guide portions 322 are formed of concave patterns, each of which is composed of one surrounding pattern 3221 and one guiding pattern 3222. Each of the patterns forming the liquid guide portions 322 is formed of a pattern that can be drawn by a single stroke, such that its end portion on the surrounding pattern 3221 side is not connected to its own surrounding pattern 3221 nor guiding pattern 3222. The surrounding patterns 3221 are arranged in the liquid repellent pattern arrangement region $R_r$, and the guiding patterns 3222 are mostly arranged in the alignment mark arrangement region $R_a$.

The liquid guide portions 322 are of a line and space form, in which the concave patterns are arranged at predetermined intervals in a direction perpendicular to the extending direction of the concave patterns. The line and space patterns of the liquid guide portions 322 are preferably more shrunk, as long as mold-releasing defects are not generated. For example, the width of each concave pattern is set to 5 nm or more and 300 nm or less, and the width of each convex pattern arranged between adjacent concave patterns is set to 5 nm or more and 300 nm or less. Further, for example, the depth of the liquid guide portions 322 may be set equal to the depth of the main patterns 21, such as 5 nm or more and 100 nm or less.

The liquid guide portions 322 are configured such that the resist is caused to surround the bubble trapping portions 321 before the main flows of the resist reach the bubble trapping portions 321, during the imprint process. Since a fine pattern generates a stronger capillary force, the liquid guide portions 322 are preferably formed of fine patterns having a width of 300 nm or less, as described above. The liquid guide portions 322 are formed of such fine patterns, so that the resist is guided at a high speed to the peripheries of the bubble trapping portions 321. Further, as explained with reference to the formula (2), in order to obtain a higher liquid repellent effect, the liquid guide portions 322 (the surrounding patterns 3221 around the bubble trapping portions 321) are set to have an occupancy area as small as possible, and the bubble trapping portions 321 are set to have an occupancy area (occupancy ratio) as large as possible.

In the example shown in FIG. 3, a combination of four concave patterns forms each liquid guide portion 322. The four concave patterns extend straight in the alignment mark arrangement region $R_a$ from near the main pattern arrangement region $R_M$ into the liquid repellent pattern arrangement region $R_r$. In the liquid repellent pattern arrangement region $R_r$, two of them become surrounding patterns 3221 arranged around a corresponding one of the bubble trapping portions 321 on the outer side, and the other two of them become surrounding patterns 3221 arranged around a corresponding one of the bubble trapping portions 321 on the inner side. In this way, this liquid guide portion 322 is provided to a combination of one outer bubble trapping portion 321 and one inner bubble trapping portion 321.

Figure 5B:
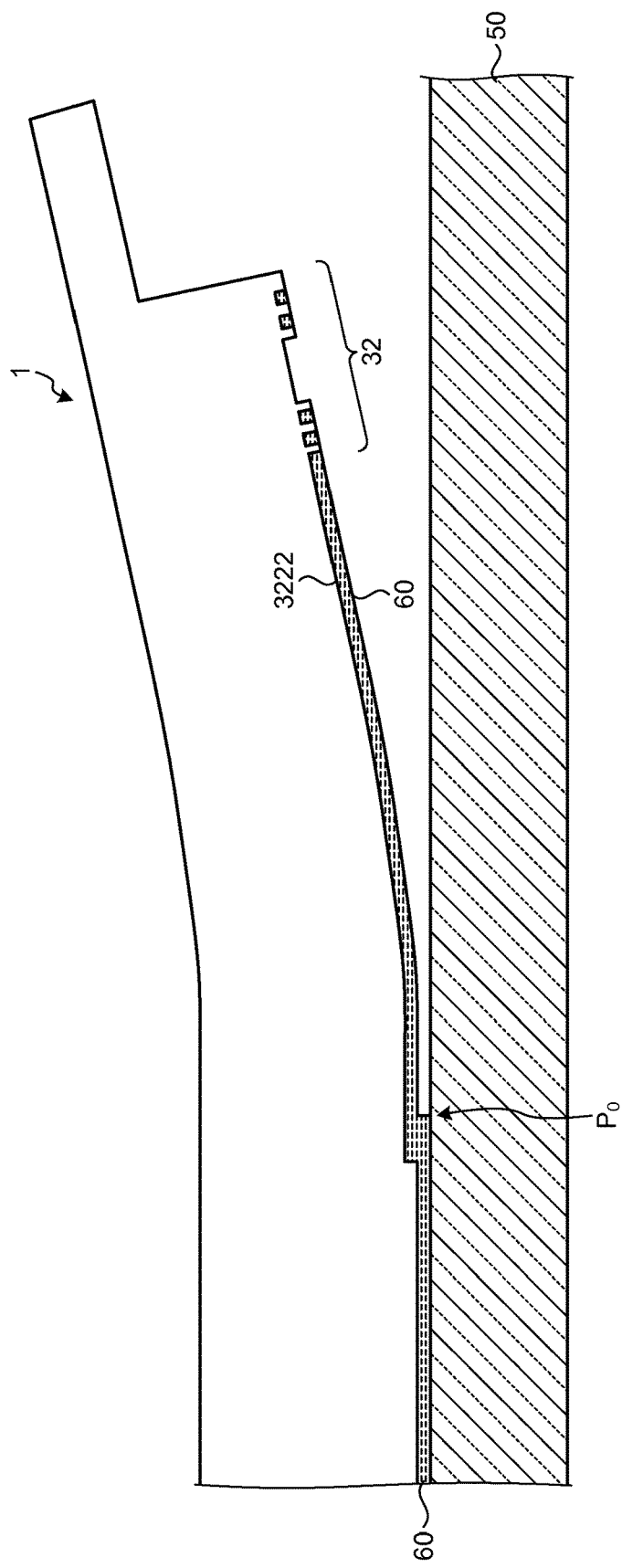

Next, an explanation will be given of an imprint method using this template 1. FIGS. 5A to 5C are partial sectional views schematically showing an example of the process sequence of an imprint method according to the first embodiment. At first, as shown in FIG. 5A, a substrate 50 is fixed onto, e.g., a stage, and a resist 60 is placed onto a shot region of the substrate 50. The resist 60 is placed at a predetermined position in the shot region by ink-jet method, for example. The shot region is an object region to which concave and convex patterns are transferred by use of the template 1. Then, the template 1 is placed such that its mesa surface 11 faces the shot region, and alignment between the substrate 50 and the template 1 is performed by use of the alignment marks (not shown). Here, as shown in FIG. 5A, the resist 60 is not placed at the position corresponding to the auxiliary pattern arrangement region $R_S$.

Thereafter, the template 1 and the substrate 50 are moved relative to each other to set a predetermined distance between the template 1 and the substrate 50, and the template 1 is pressed onto the substrate 50. Then, as shown in FIG. 5B, the pressing state is controlled such that a near center of the template 1 is first brought into contact with the substrate 50 through the resist 60, and then the pressing region is sequentially and continuously expanded outward. At this time, the pressing state is preferably controlled such that a pressing state where the auxiliary pattern arrangement region $R_S$ is out of contact with the substrate 50 is held for a predetermined hold time (rest time) before the auxiliary pattern arrangement region $R_S$ of the mesa surface 11 is brought into contact with the substrate 50. Specifically, as shown in FIG. 5B, it waits the lapse of the hold time, while keeping a state where the main pattern arrangement region $R_M$ is in a pressing state and the auxiliary pattern arrangement region $R_S$ is out of contact with the substrate 50.

As the pressing region is sequentially and continuously expanded from the near center of the template 1 toward the outer periphery of the main pattern arrangement region $R_M$, the leading ends of fluxes of the resist 60 placed near the peripheral edge portion of the main pattern arrangement region $R_M$ spread toward the auxiliary pattern arrangement region $R_S$. Then, when the leading ends $P_O$ of the main flow fluxes of the resist reach the end portions of the guiding patterns 3222 in the auxiliary pattern arrangement region $R_S$, the resist 60 is caused by a capillary force to flow through the guiding patterns 3222 and thereby to reach the surrounding patterns 3221 arranged on the outer peripheral side of the auxiliary pattern arrangement region $R_S$. Consequently, there is formed a state where the surrounding patterns 3221 arranged around the bubble trapping portions 321 are filled with the resist 60. Here, it suffices if the hold time is set to have a period to fill the surrounding patterns 3221 with the resist 60. The necessary hold time depends on the size and/or arrangement of the patterns of the liquid guide portions 322, but, in general, a period of one second is enough to fill the surrounding patterns 3221 with the resist 60.

After the lapse of the hold time, as shown in FIG. 5C, the auxiliary pattern arrangement region $R_S$ is brought into contact with the substrate 50 through the resist 60, so that the entire mesa surface 11 of the template 1 is set in a pressing state. Then, this state is held for a predetermined time. At this time, the resist 60 placed on the main pattern arrangement region $R_M$ is filled into the main patterns 21. Further, while the resist 60 is filled into the main patterns 21, the resist 60 is also caused to flow to the auxiliary pattern arrangement region $R_S$. Those portions of the resist 60 which have reached the auxiliary pattern arrangement region $R_S$ move in directions toward the mesa end 111 with the lapse of time. Then, those portions of the resist 60 which surround, like rings, the peripheries of the bubble trapping portions 321 are instantaneously unified with the main flow surface of the resist 60. Consequently, the bubble trapping portions 321 can form bubble trapping, and, in other words, the bubble trapping portions 321 can trap the process atmosphere. Because of the lotus effect manifested by the bubble trapping portions 321, the main flows of the resist 60 cannot move beyond the liquid repellent patterns 32 to the mesa end 111 side, but are stopped. As a result, it becomes possible to prevent the resist 60 from flowing out onto the mesa end 111 side.

After the lapse of a predetermined time, the resist 60 is irradiated with ultraviolet rays from above the template 1, for example, and the resist 60 is thereby cured. Then, the template 1 is released from the substrate 50. Thereafter, the process steps described above are repeatedly performed to the respective shot regions on the substrate 50.

According to the first embodiment, the liquid repellent patterns 32 are formed along the peripheral edge portion of the mesa surface 11 of the template 1. The liquid repellent patterns 32 include the bubble trapping portions 321, and the liquid guide portions 322 of a line and space form, which are composed of the surrounding patterns 3221 arranged along the outer peripheries of the bubble trapping portions 321, and the guiding patterns 3222 connected to the surrounding patterns 3221. With this arrangement, the lotus effect is manifested by the bubble trapping portions 321 filled with gas, during the imprint process. Thus, that part of the resist 60 which has moved from the main pattern arrangement region $R_M$ to the auxiliary pattern arrangement region $R_S$ cannot move onto the mesa end 111 side beyond the liquid repellent patterns 32, but is stopped. As a result, it is possible to prevent the resist 60 from leaking out from the mesa end 111.

Further, according to the first embodiment, since a leaked resist portion having a height of several μm is not formed by part of the resist leaked out from the mesa end 111 and solidified, it is possible to prevent generation of resist residues in the resist removal step after the processing. In addition, when the imprint process is applied to a region near a region processed by the imprint process, it is possible to prevent the leaked resist portion from hindering pressing of the template 1. Further, since the leaked resist portion is not formed, it is possible to prevent such a conventional phenomenon that the leaked resist portion deposited on the template 1 drops on the substrate 50 during the subsequent imprint process.

(Second Embodiment)

In the first embodiment, the liquid guide portions of the liquid repellent patterns are arranged in the auxiliary pattern arrangement region and extend toward the mesa end side from near the boundary between this region and the main pattern arrangement region. In the second embodiment, an explanation will be given of a structure that can supply the resist to the surrounding patterns faster than the structure according to the first embodiment.

Figure 6:
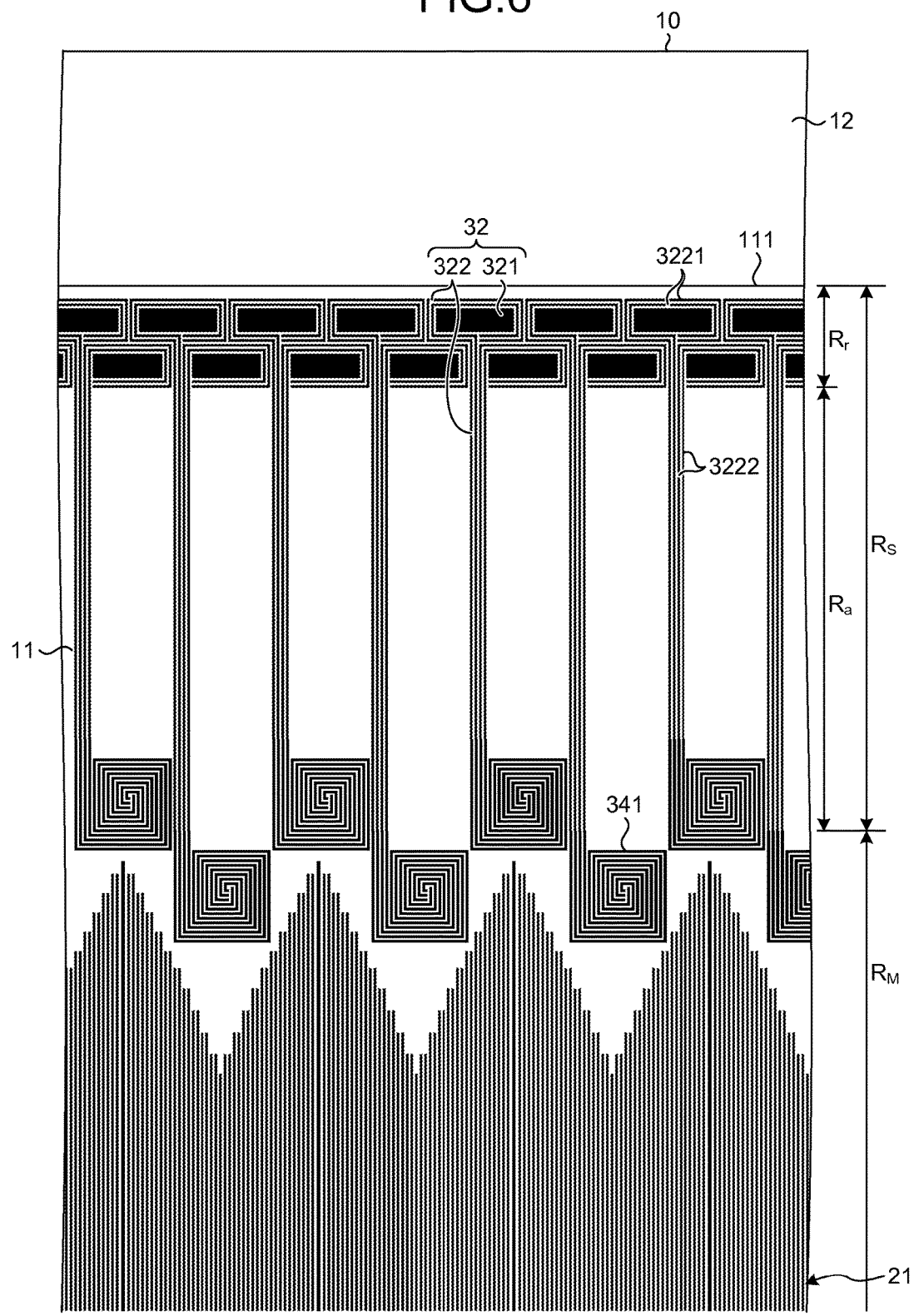
FIG. 6 is a partial plan view schematically showing an example of patterns on a mesa surface, which include liquid repellent patterns, according to a second embodiment.

FIG. 6 is a partial plan view schematically showing an example of patterns on a mesa surface, which include liquid repellent patterns, according to the second embodiment. The liquid repellent patterns 32 according to the second embodiment include bubble trapping portions 321, liquid guide portions 322, and liquid collecting portions 341. The liquid collecting portions 341 are respectively connected to the ends of the liquid guide portions 322 opposite to the bubble trapping portions 321. In the example shown in FIG. 6, the liquid collecting portions 341 are arranged not only in the auxiliary pattern arrangement region $R_S$ but also in the main pattern arrangement region $R_M$.

In the first embodiment, unless the resist 60 reaches the ends of the liquid guide portions 322 on the main pattern arrangement region $R_M$ side, the resist 60 is not filled into the liquid guide portions 322. On the other hand, in the second embodiment, the liquid collecting portions 341 having a large surface area are arranged at the ends of the liquid guide portions 322 on the main pattern arrangement region $R_M$ side. Since such liquid collecting portions 341 are provided, the resist 60 is immediately filled into the liquid guide portions 322, when the resist 60 reaches part of the liquid collecting portions 341. Further, in the case of the liquid collecting portions 341 having a larger surface area as compared with the point-like end areas of the liquid guide portions 322, they can come into contact with the main flows of the resist 60 at an earlier timing with a high probability, so that the resist 60 can be filled into the liquid guide portions 322 at an earlier stage as compared with the first embodiment.

Further, some of the vortical patterns forming the liquid collecting portions 341 are arranged in the main pattern arrangement region $R_M$ at places where the main patterns 21 are not formed. This arrangement can be adopted only in a case where there is no problem caused when manufacturing a semiconductor device, even if some of the liquid collecting portions 341 are arranged in the main pattern arrangement region $R_M$ at places where the main patterns 21 are not formed.

Here, the liquid collecting portions 341 are formed as an extension of the liquid guide portions 322, and thus the liquid collecting portions 341 are also structured to have a line and space form, in which a concave pattern and a convex pattern are alternately arranged, as in the liquid guide portions 322. In the example shown in FIG. 6, the liquid collecting portions 341 have a structure such that a vortical concave pattern and a vortical convex pattern are alternately arranged. Further, each liquid collecting portion 341 preferably has a size that can be stored within a circular region having a diameter of 200 μm, for example.

The distance between adjacent liquid collecting portions 341 is preferably set to be almost the same as the distance between adjacent portions of the resist 60 dropped during the imprint process. Consequently, during the imprint process, the main flows of the resist 60 at the respective drop positions can come into contact with any one of the liquid collecting portions 341. Here, the constituent elements corresponding to those described in the first embodiment are denoted by the same reference symbols, and their description is omitted.

Figure 7:
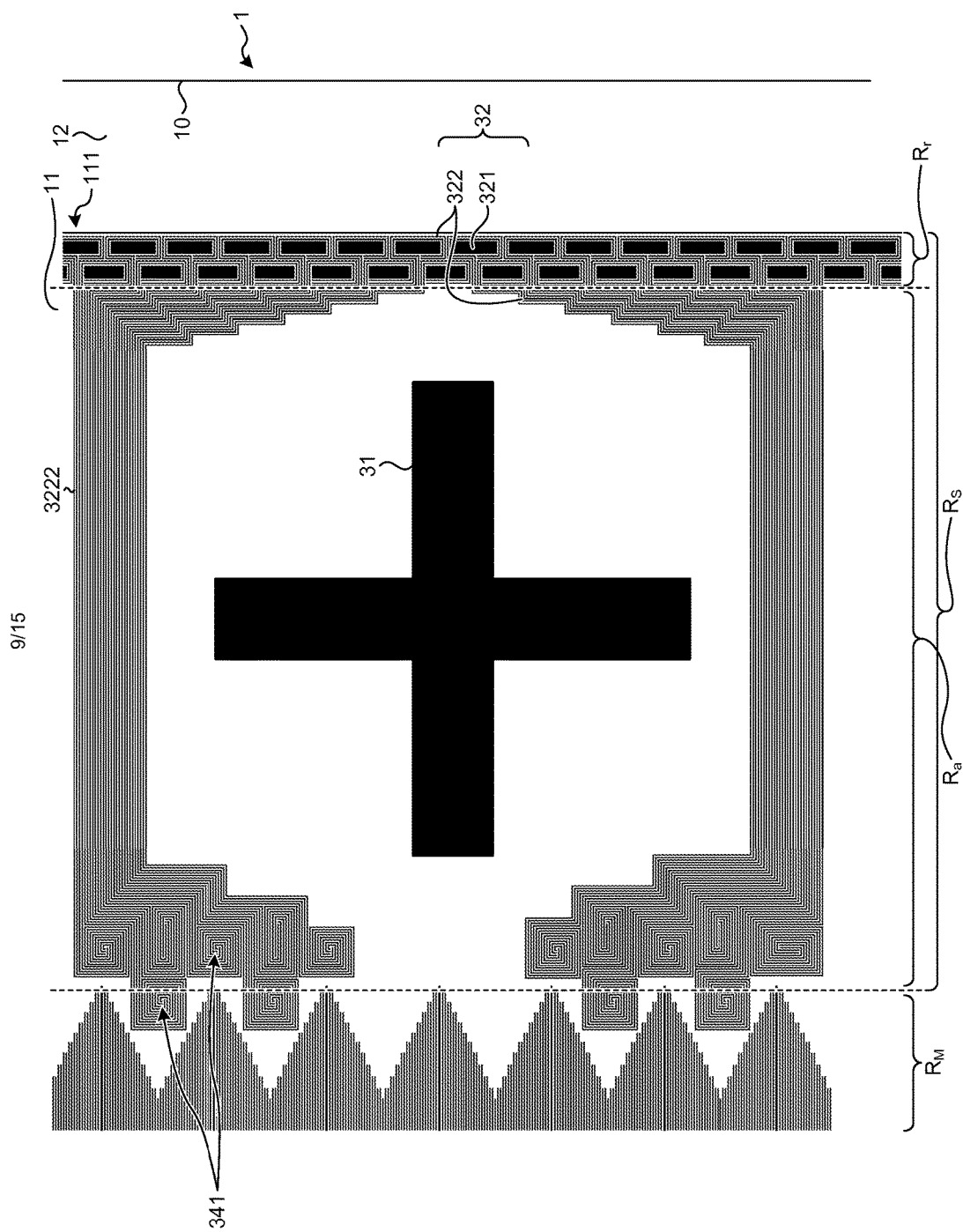
FIG. 7 is a partial plan view schematically showing an example of liquid repellent patterns in an alignment mark arrangement region according to the second embodiment.

FIG. 7 is a partial plan view schematically showing an example of liquid repellent patterns in an alignment mark arrangement region according to the second embodiment. Alignment marks 31 are arranged in an alignment mark arrangement region $R_a$ inside the auxiliary pattern arrangement region $R_S$. At the place where each alignment mark 31 is arranged, the liquid repellent patterns 32 cannot be arranged in the structure shown in FIG. 6. Accordingly, as shown in FIG. 7, the liquid repellent patterns 32 are arranged in a structure such that the guiding patterns 3222 extend along a roundabout route to bypass the portion corresponding to the alignment mark 31. Further, in this structure, a plurality of liquid collecting portions 341 are arranged adjacent to each other. In this way, the liquid repellent patterns 32 are provided also in the regions where the alignment marks 31 are respectively present.

The liquid collecting portions 341 may be formed of vortical patterns of a line and space form, as shown in FIGS. 6 and 7, or may be formed of other patterns. Further, the liquid collecting portions 341 may be formed such that adjacent concave patterns are connected to each other. FIGS.

8A to 8C are plan views showing other examples of a liquid collecting portion according to the second embodiment. FIG. 8A shows a case where a liquid collecting portion 341 is formed of meandering patterns of a line and space form. FIG. 8B shows a case where a liquid collecting portion 341 is formed of lattice patterns. FIG. 8C shows a case where a liquid collecting portion 341 is formed of concave patterns, each of which is branched into five straight concave patterns.

Here, the liquid collecting portions 341 shown in FIG. 6 are exemplified as being arranged in both of the auxiliary pattern arrangement region $R_S$ and the main pattern arrangement region $R_M$, but they may be arranged only in the auxiliary pattern arrangement region $R_S$, or only in the main pattern arrangement region $R_M$.

Further, a pattern formation method according to the second embodiment is substantially the same as the pattern formation method described in the first embodiment, and so its description will be omitted. However, since the resist 60 reaches the surrounding patterns 3221 at an earlier time as compared with the first embodiment, it is possible to shorten the predetermined hold time explained in the first embodiment, which is used to hold the state immediately before the auxiliary pattern arrangement region $R_S$ is brought into contact with the substrate 50.

According to the second embodiment, the end areas of the liquid guide portions 322 on the main pattern arrangement region $R_M$ side are provided with the liquid collecting portions 341 having a two-dimensional spread. Consequently, when the main flow fluxes of the resist 60 come into contact with part of the liquid collecting portions 341, the resist 60 is caused by a capillary force to flow from the liquid collecting portions 341 through the guiding patterns 3222 into the surrounding patterns 3221, so that the liquid guide portions 322 are filled with the resist 60. Further, according to the second embodiment, since the liquid collecting portions 341 are arranged in a wide area, the concave patterns of the liquid guide portions 322 can be filled with the resist 60 at an earlier time after starting the imprint process, as compared with the first embodiment. As a result, it is possible to shorten the time necessary for holding a state where the auxiliary pattern arrangement region $R_S$ is out of contact with the substrate 50, during the imprint process.

(Third Embodiment)

In the first and second embodiments, an explanation has been given of a case where only the liquid repellent patterns are arranged in the auxiliary pattern arrangement region. However, a conventionally proposed structure for delaying resist propagation may be included in this region.

Figure 9:
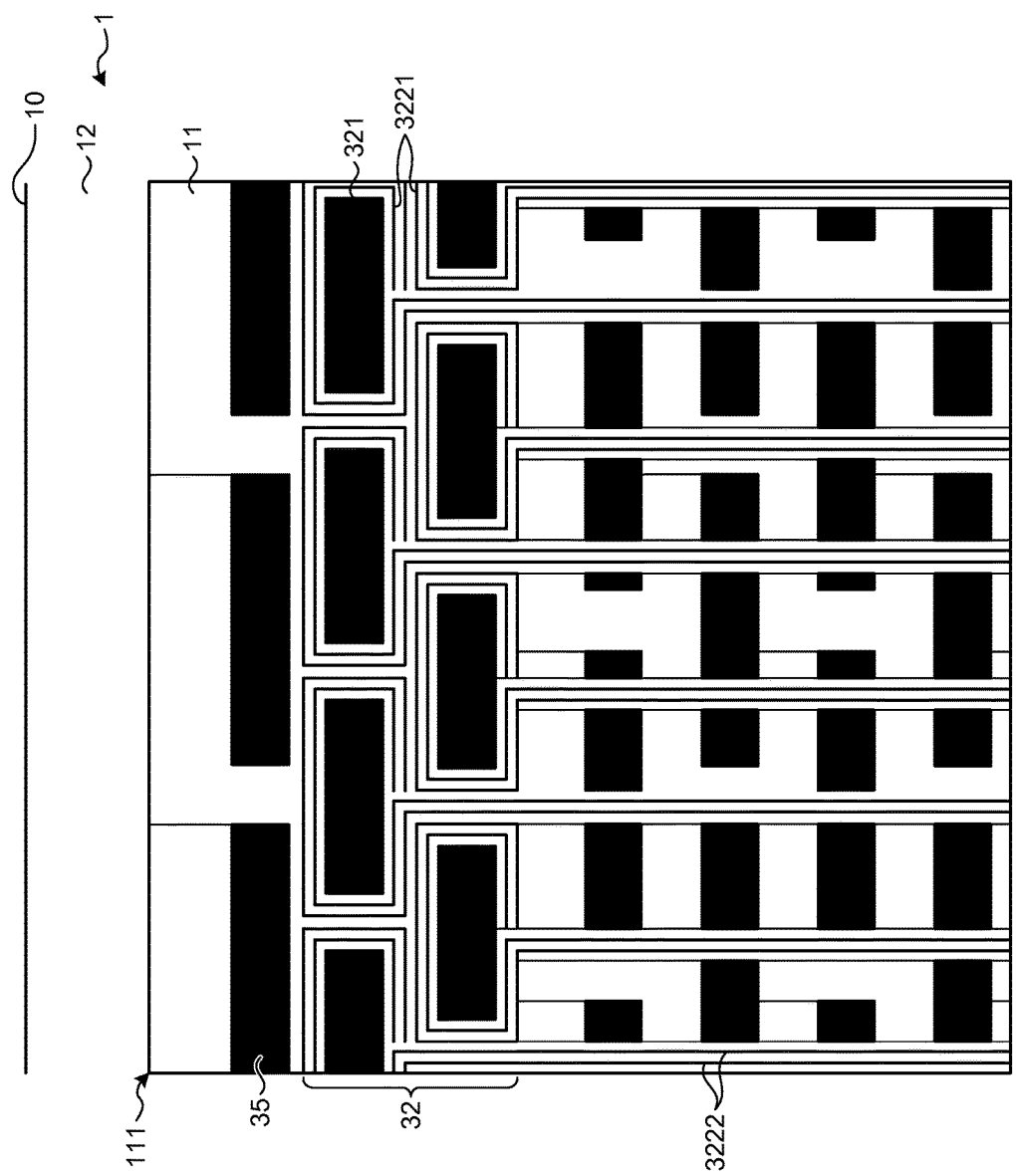
FIG. 9 is a partial plan view schematically showing an example of patterns on a mesa surface, which include liquid repellent patterns, according to a third embodiment.

FIG. 9 is a partial plan view schematically showing an example of patterns on a mesa surface, which include liquid repellent patterns, according to a third embodiment. In the example shown in FIG. 9, propagation delay patterns 35 for delaying propagation of the resist 60 are provided on the mesa end 111 side further from the liquid repellent patterns 32. The propagation delay patterns 35 may be formed of concave patterns or convex patterns.

If the propagation delay patterns 35 are formed of convex patterns, the main flows of the resist 60 come into contact with the convex patterns, so that their propagation is delayed. Thus, the convex patterns are arranged to generate resistance to the main flows of the resist 60. On the other hand, if the propagation delay patterns 35 are formed of concave patterns, the main flows of the resist 60 come into contact with the concave patterns and fill the concave patterns with the resist 60, so that their propagation is delayed. In FIG. 9, the propagation delay patterns 35 are arrayed in one row, but they may be arrayed in two rows or more.

The propagation delay patterns 35 is sized, in light of the function to delay propagation of the resist 60, such that, if they are formed of rectangular patterns when seen in the plan view, each of them has a one-side length of 1 μm or more and a height or depth of 300 nm or less, for example. Further, they are exemplified by rectangular patterns here, but they may be formed of patterns each having another shape, such as a circle, ellipse, or polygon.

Further, the propagation delay patterns 35 are exemplified as being arranged outside the bubble trapping portions 321, but the propagation delay patterns 35 may be arranged at any position. For example, they may be arranged inside the bubble trapping portions 321.

A pattern formation method according to the third embodiment is substantially the same as the pattern formation method described in the first embodiment, and so its description will be omitted.

According to the third embodiment, in addition to the bubble trapping portions 321, the propagation delay patterns 35 are arranged in the auxiliary pattern arrangement region $R_S$. Consequently, for example, even if the liquid repellent patterns 32 of the template 1 generate faults and fail in the liquid repellency for the resist 60 moving from the main pattern arrangement region $R_M$, the propagation delay patterns 35 can delay propagation of the main flows of the resist 60. As a result, it is possible to suppress the resist 60 from leaking out onto the mesa end 111.

(Fourth Embodiment)

In the first to third embodiments, an explanation has been given of a template for forming patterns by pressing one by one the shot regions preset on a wafer. In the fourth embodiment, an explanation will be given of a wafer level template for forming patterns on the entire wafer by pressing it all at once.

Figure 10A:
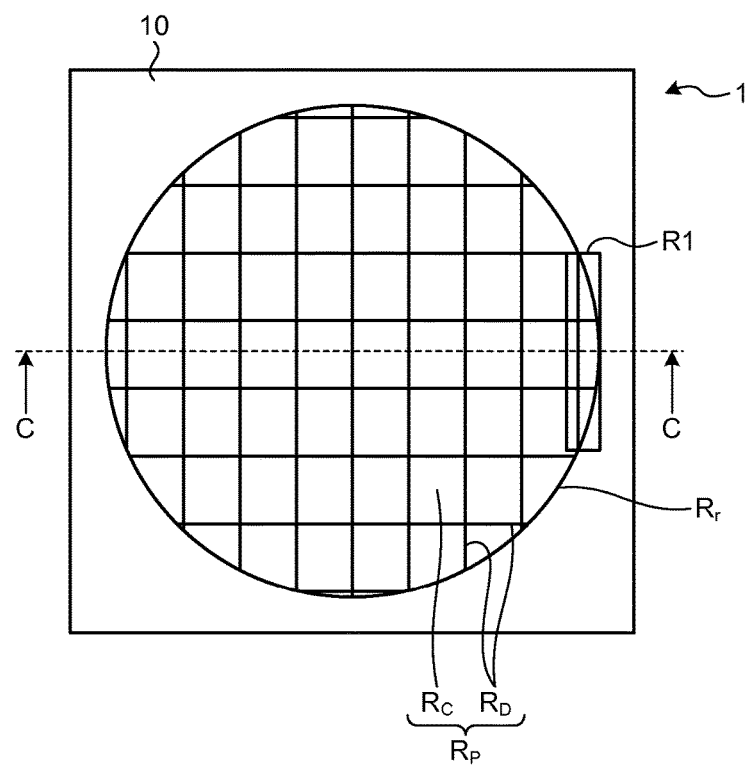
FIGS. 10A and 10B are views schematically showing an example of the structure of a wafer level template according to a fourth embodiment.
Figure 10B:
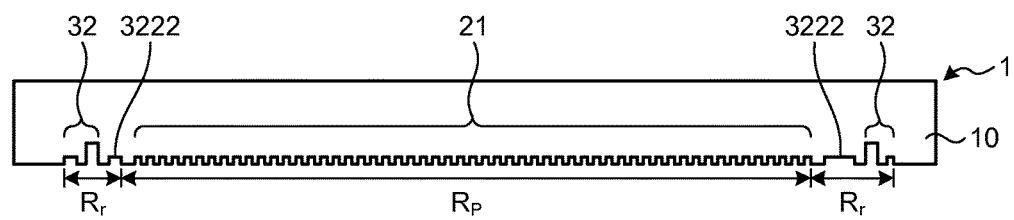
Figure 11A:
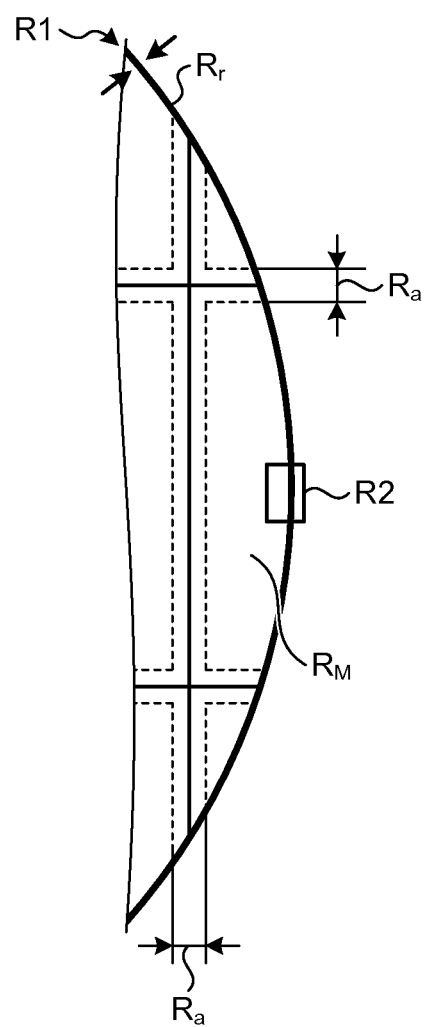
FIG. 11A is a view schematically showing an example of the structure of liquid repellent patterns on the wafer level template according to the fourth embodiment.
Figure 11B:
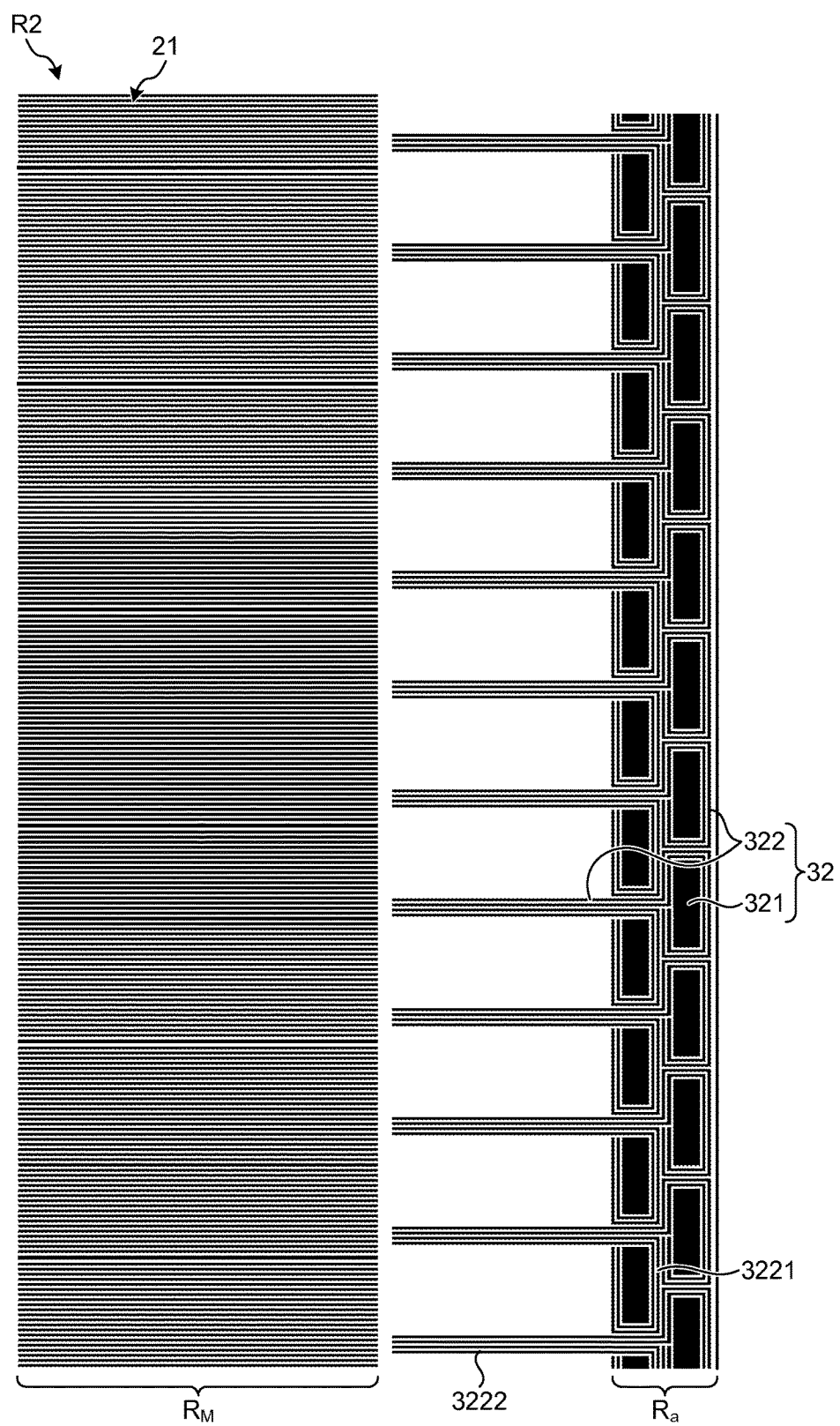
FIG. 11B is a view schematically showing the example of the structure of the liquid repellent patterns on the wafer level template according to the fourth embodiment.

FIGS. 10A and 10B are views schematically showing an example of the structure of a wafer level template according to the fourth embodiment, FIG. 10A is a view schematically showing an example of the plan view on the pattern formation face side of the wafer level template, and FIG. 10B is a sectional view taken along a line C-C in FIG. 10A. Further, FIGS. 11A and 11B are views schematically showing an example of the structure of liquid repellent patterns on the wafer level template according to the fourth embodiment, FIG. 11A is an enlarged partial view of a region R1 in FIG. 10A, and FIG. 11B is an enlarged partial sectional view of a region R2 in FIG. 11A.

The wafer level template 1 is provided with a pattern arrangement region $R_P$ and a liquid repellent pattern arrangement region $R_r$ on one of the main faces of a template substrate 10. Here, the liquid repellent pattern arrangement region $R_r$ preferably has a width of 500 μm or less. Further, unlike the first to third embodiments, the template 1 according to the fourth embodiment does not have a mesa structure.

The pattern arrangement region $R_P$ includes chip regions $R_C$ each corresponding to one chip, and dicing regions $R_D$ arranged between the chip regions $R_C$. Each chip region $R_C$ is formed of a rectangular region, for example, when seen in the plan view. In each chip region $R_C$, main patterns 21 for forming, e.g., a semiconductor device are arranged, wherein, for example, the main patterns 21 include a memory pattern for forming a NAND type flash memory, and a peripheral circuit pattern for forming a peripheral circuit for driving the NAND type flash memory. The concave portions of these main patterns 21 have a depth of several tens nm, for example.

The dicing regions $R_D$ are regions corresponding to dicing lines for separating the respective chip regions $R_C$ after semiconductor devices are formed on the wafer. The dicing regions $R_D$ are provided with alignment marks.

The liquid repellent pattern arrangement region $R_r$ is arranged along the outer periphery of the pattern arrangement region $R_P$, and is provided with liquid repellent patterns 32. For example, as shown in FIG. 10, a chip region $R_C$, through which the liquid repellent pattern arrangement region $R_r$ passes, is provided with liquid repellent patterns 32 at the outer periphery of the arrangement region of main patterns 21. Further, a dicing region $R_D$, through which the liquid repellent pattern arrangement region $R_r$ passes, is provided with liquid repellent patterns 32 at the outer periphery of the dicing region $R_D$. The liquid repellent patterns 32 may be formed of those explained in any one of the first to third embodiments described above. In the example shown in FIG. 11B, the patterns explained in the first embodiment are arranged. Here, there are no patterns arranged around the liquid repellent pattern arrangement region $R_r$.

Further, in the example shown in FIGS. 10A and 10B, the wafer has a circular shape. However, if the wafer has a rectangular shape, the pattern arrangement region $R_P$ is also designed to have a rectangular shape in accordance with the wafer shape, and the liquid repellent pattern arrangement region $R_r$ is designed to have a rectangular ring shape. Further, as in the first to third embodiments, the template 1 may be designed to have a mesa structure, in which the pattern arrangement region $R_P$ and the liquid repellent pattern arrangement region $R_r$ are arranged on the mesa surface.

Further, a pattern formation method according to the fourth embodiment is substantially the same as the pattern formation method described in the first embodiment, and so its description will be omitted.

According to the fourth embodiment, the wafer level template 1 is provided with the pattern arrangement region $R_P$ including a plurality of chip regions $R_C$ and dicing regions $R_D$, and is further provided with the liquid repellent pattern arrangement region $R_r$ arranged at the outer periphery of the pattern arrangement region $R_P$. As a result, it is possible to perform wafer level pattern transfer by use of an imprint method, while utilizing a lotus effect of the liquid repellent patterns 32 to prevent the resist from leaking to the outside of the pattern arrangement region $R_P$.

Figure 12A:
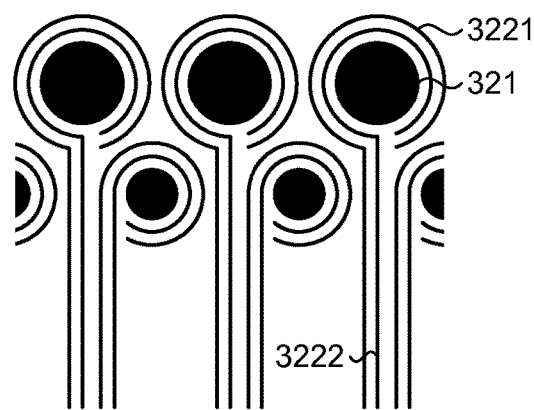
FIGS. 12A and 12B are views showing other examples of bubble trapping portions.
Figure 12B:
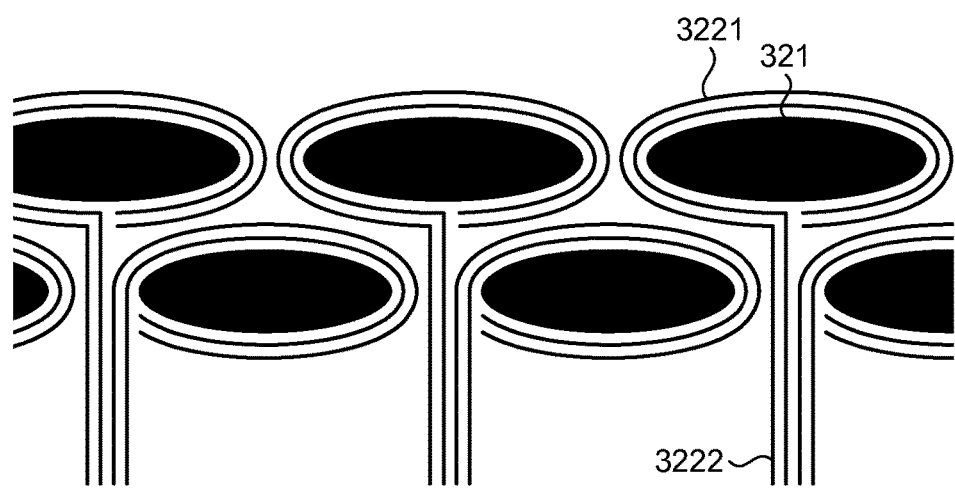

The embodiments described above illustrate a case where the bubble trapping portions 321 each having a rectangular shape are used for the liquid repellent patterns 32. However, each bubble trapping portion 321 may be designed to have another shape. FIGS. 12A and 12B are views showing other examples of bubble trapping portions. In FIG. 12A, each bubble trapping portion 321 has a circular shape. In this case, each surrounding pattern 3221 of the liquid guide portions 322 is designed to have a circular ring shape surrounding the periphery of the corresponding one of the circular bubble trapping portions 321. Further, in FIG. 12B, each bubble trapping portion 321 has an elliptical shape. In this case, each surrounding pattern 3221 of the liquid guide portions 322 is designed to have an elliptical ring shape surrounding the periphery of the corresponding one of the elliptical bubble trapping portions 321. Other than these examples, each bubble trapping portion 321 may be designed to have a polygonal shape, such as a triangle, pentagon, or more polygonal shape.

Further, in the explanation described above, the resist is made of a photo-setting resin, but the resist may be made of a thermo-setting resin. In this case, the resist is cured by heating the resist, in place of irradiation with light (ultraviolet rays).

Further, in the explanation described above, the liquid repellent patterns 32 are exemplified as being provided to the template 1 including concave and convex patterns formed on the one of the main faces, but the liquid repellent patterns 32 may be provided to the template substrate 10 in a state before concave and convex patterns are formed. In this case, the liquid repellent patterns 32 may be provided along the periphery of a region where concave and convex patterns are to be arranged.

Further, in the explanation described above, the term "pressing" is used. The "pressing" according to the embodiments includes not only a case where the template 1 is brought into contact with the substrate 50 to fill the resist 60 into the concave portions of concave and convex patterns on the template 1, but also a case where the template 1 is brought into contact with the resist 60 on the substrate 50 to fill the resist 60 into the concave portions of concave and convex patterns on the template 1 by a capillary phenomenon.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising:
a template pattern formed on a substrate;
and a liquid repellent pattern that has liquid repellency to a resist and is disposed on a periphery of a region for arrangement of the template pattern,
wherein
the liquid repellent pattern includes
a portion formed of a concave portion, and
a liquid guide portion that guides the resist from the region for arrangement of the template pattern to a periphery of the portion formed of the concave portion, and
the liquid guide portion includes
a surrounding pattern concentrically surrounding the periphery of the portion formed of the concave portion with a predetermined distance from the portion formed of the concave portion, and
a guiding pattern having one end connected to the surrounding pattern, and another end positioned on a side of the region for arrangement of the template pattern.

2. The template according to claim 1, wherein the other end of the guiding pattern is positioned near a pattern at a peripheral edge portion of the region for arrangement of the template pattern.

3. The template according to claim 1, wherein the liquid repellent pattern further includes a liquid collecting portion connected to the other end of the guiding pattern, and that guides the resist, which has flowed to near the other end of the guiding pattern, to the liquid guide portion.

4. The template according to claim 1, wherein the portion formed of the concave portion has a dimension of 0.5 pm or more when seen in a plan view, and the concave portion has a depth of 300 nm or less.

5. The template according to claim 1, wherein the portion formed of the concave portion has a rectangular, circular, elliptical, or polygonal shape, when seen in a plan view.

6. The template according to claim 1, wherein the liquid guide portion has a structure in which a plurality of first concave patterns are arranged at predetermined intervals in a direction perpendicular to an extending direction of the first concave patterns.

7. The template according to claim 6, wherein the first concave patterns have a width of 300 nm or less and a depth of 100 nm or less.

8. The template according to claim 3, wherein the liquid guide portion includes a first concave pattern, and
the liquid collecting portion includes a second concave pattern connected to the first concave pattern.

9. The template according to claim 8, wherein the liquid collecting portion is arranged such that the second concave pattern is in a vortical, meandering, or lattice state.

10. The template according to claim 8, wherein the liquid collecting portion is arranged such that one second concave pattern is branched into a plurality of patterns.

11. The template according to claim 1, further comprising propagation delay patterns arranged in parallel with the portions formed of the concave portion, and that delays propagation of the resist.

12. The template according to claim 1, wherein an auxiliary pattern arrangement region is present at an outer periphery of the region for arrangement of the template pattern,
main patterns forming a device are arranged in the region for arrangement of the template pattern,
alignment marks and the liquid repellent pattern are arranged in the auxiliary pattern arrangement region, and
the liquid repellent pattern is arranged at a peripheral edge portion of the auxiliary pattern arrangement region.

13. The template according to claim 12, wherein the substrate has a mesa structure in which a central region protrudes than a peripheral edge region, and
the region for arrangement of the template pattern and the auxiliary pattern arrangement region are provided in the central region.

14. The template according to claim 1, wherein a liquid repellent pattern arrangement region is provided at an outer periphery of the region for arrangement of the template pattern,
the region for arrangement of the template pattern includes a plurality of chip regions serving as a unit forming a device, and a plurality of dicing regions dividing the chip regions, and
the liquid repellent pattern is arranged in the liquid repellent pattern arrangement region.

15. The template according to claim 14, wherein the region for arrangement of the template pattern has a surface area equal to a process object.

16. The template according to claim 14, wherein the template substrate has a mesa structure in which a central region protrudes than a peripheral edge region, and
the region for arrangement of the template pattern and the liquid repellent pattern arrangement region are provided in the central region.

* * * * *